United States Patent
Harlev et al.

(10) Patent No.: US 8,076,925 B2
(45) Date of Patent: Dec. 13, 2011

(54) OPTICAL SENSOR ASSEMBLY FOR INSTALLATION ON A CURRENT CARRYING CABLE

(75) Inventors: Joseph Yossi Harlev, Trophy Club, TX (US); Rhad Veazey, Paradise, TX (US); Leonard Johnson, Leander, TX (US); Theodore Konetski, Azle, TX (US)

(73) Assignee: Optisense Network, Inc., Bridgeport, TX (US)

( * ) Notice: Subject to any disclaimer, the term of this patent is extended or adjusted under 35 U.S.C. 154(b) by 239 days.

(21) Appl. No.: 12/607,954

(22) Filed: Oct. 28, 2009

(65) Prior Publication Data

US 2011/0095749 A1     Apr. 28, 2011

(51) Int. Cl.
G01R 1/20 (2006.01)
G01R 13/38 (2006.01)
G01R 15/20 (2006.01)
G01R 31/40 (2006.01)

(52) U.S. Cl. ............... 324/97; 324/126; 324/764.01; 324/117 H

(58) Field of Classification Search ........... 324/117 H, 324/117 R, 126, 127, 72.5, 754.21–754.23, 324/750.23, 762.01–762.1, 207.13, 234, 324/239, 242, 243; 439/858, 822; 315/297, 315/294

See application file for complete search history.

(56) References Cited

U.S. PATENT DOCUMENTS

| | | | |
|---|---|---|---|
| 2,709,800 A | 5/1955 | Temple et al. | |
| 4,216,503 A | 8/1980 | Wiggins | |
| 4,590,505 A | 5/1986 | Bluzer | |
| 4,635,055 A | 1/1987 | Fernandes et al. | |
| 4,758,962 A | 7/1988 | Fernandes et al. | |
| 4,799,005 A | 1/1989 | Fernandes et al. | |
| 4,869,254 A | 9/1989 | Stone | |
| 4,947,107 A | 8/1990 | Doerfler et al. | |
| 4,999,571 A | 3/1991 | Ishiko et al. | |
| 5,029,101 A | 7/1991 | Fernandes et al. | |
| 5,114,228 A | 5/1992 | Greenfield et al. | |
| 5,731,579 A | 3/1998 | Woods | |
| 5,892,357 A | 4/1999 | Woods et al. | |
| 5,939,711 A | 8/1999 | Crawford et al. | |
| 5,963,026 A | 10/1999 | Bosselmann et al. | |

(Continued)

OTHER PUBLICATIONS

Authors: Slobodan Petricevic, Slatan Stojkovic and Jovan B. Radunovic; Title: Development of a Portable Fiber-Optic Current Senso for Power Systems Monitoring; Publication: IEEE Transactions on Instrumentation and Measurement, vol. 53 No. 1, Feb. 2004.

(Continued)

Primary Examiner — Huy Q Phan
Assistant Examiner — Tung X Nguyen
(74) Attorney, Agent, or Firm — Eric Karich

(57) ABSTRACT

An optical sensor assembly has a base unit, an optical current sensor, and a magnetic concentrator. The optical current sensor is mounted on the base unit and includes a polarized light input, a reflective prism, and a light output. The magnetic concentrator defines an airgap and is mounted on a concentrator housing such that the magnetic concentrator fits around the current carrying cable when the base unit is hung from the current carrying cable by hooks and when the concentrator housing is moved to a closed position. The reflective prism of the base unit is operably positioned in the airgap of the magnetic concentrator when the concentrator housing is in the closed position. The assembly further includes a voltage sensor operably positioned in the base unit for measuring the voltage of the current carrying cable.

16 Claims, 7 Drawing Sheets

U.S. PATENT DOCUMENTS

| | | |
|---|---|---|
| 6,072,366 A | 6/2000 | Maeda et al. |
| 6,124,706 A | 9/2000 | Woods et al. |
| 6,166,816 A | 12/2000 | Blake |
| 6,307,666 B1 | 10/2001 | Davidson et al. |
| 6,362,615 B1 | 3/2002 | Davidson et al. |
| 6,388,434 B1 | 5/2002 | Davidson et al. |
| 6,462,327 B1 | 10/2002 | Ezell |
| 6,541,955 B2 * | 4/2003 | Landre ............ 324/127 |
| 6,630,819 B2 | 10/2003 | Lanagan et al. |
| 6,753,913 B1 | 6/2004 | Bilhan |
| 6,844,799 B2 | 1/2005 | Attarian et al. |
| 7,068,025 B2 | 6/2006 | Bjorn |
| 7,129,693 B2 | 10/2006 | Yakymyshyn et al. |
| 7,164,263 B2 | 1/2007 | Yakymyshyn et al. |
| 7,199,571 B2 | 4/2007 | Johnson et al. |
| 7,884,598 B2 * | 2/2011 | Wang et al. ............ 324/127 |

OTHER PUBLICATIONS

Authors: Slobodan Petricevic, Slatan Stojkovic and Jovan B. Radunovi; Title: Practical Application of Fiber-Optic Current Sensor in Power System Harmonic Measurement, vol. 55, No. 3, Jun. 2006. www.fieldmetrics.net.

* cited by examiner

OPTICAL SENSOR ASSEMBLY FOR INSTALLATION ON A CURRENT CARRYING CABLE

CROSS-REFERENCE TO RELATED APPLICATIONS

Not Applicable

STATEMENT REGARDING FEDERALLY SPONSORED RESEARCH

Not Applicable

BACKGROUND OF THE INVENTION

1. Field of the Invention

This invention relates generally to an optical sensor assembly for installation on a current carrying cable, and more particularly to an optical sensor for sensing both the current and the voltage levels in the cable.

2. Description of Related Art

A variety of sensors have been developed for measuring the current in a current carrying cable, such as that of a high voltage electricity distribution system. Optical current sensors based on the Faraday effect are known in the art. Optical current sensors that use bulk glass or fiber optic cable that surround the current carrying cable have very high dynamic range but require opening the current carrying cable at installation, hence are expensive.

Optical current sensors utilizing a magnetic concentrator with bulk optics in an airgap are also known in the art. One such embodiment is discussed in an article titled 'Use of Dual Frequency Excitation Method to Improve the Accuracy of an Optical Current Sensor,' by Shuping Wang, et al, SPIE meeting, August, 2009. The airgap stabilizes the temperature sensitivity of the magnetic material, as discussed in the publication 'Gapped Magnetic Core Structures,' by Gunter B. Finke, Magnetic Metals Corporation, Camden, N.J. 08101.

However, due to saturation, the magnetic concentrator may limit the dynamic range. An electric utility has various requirements for the dynamic range of the current sensors, depending on the application. For example, for metering and demand response, dynamic ranges of about 0 to >2× the nominal current may be acceptable. When fault detection is required, a dynamic range similar to >10× the nominal current has to be measured in real time. For assessment of power quality, the measurement of the harmonics is critical, so higher bandwidths such as ~45-~6,000 Hz may be typically required. Smart grids deliver electricity from suppliers to consumers using digital technology to save energy, reduce cost, and increase reliability and transparency. Particularly with such smart grids, utilities and industrials will require that the same sensor be used for multiple purposes. Increasing the airgap of the magnetic concentrator may increase the saturation level but may also increase the sensitivity to adjacent fields. Available materials and processes enable the magnetic concentrator to have a distributed airgap that can increase the saturation level without significantly increasing the sensitivity to adjacent fields.

Traditional sensors are typically separate for different applications. For example, current and voltage transformers are used for metering and demand response, while Rogowsky Coil or Hall effect devices are used for fault allocation and system protection. A fully fiber optic or bulk current sensor can naturally be used for all applications but is expensive and cannot be clamped to the cable.

Woods et al., U.S. Pat. No. 5,892,357, discloses an electro-optic voltage sensor for sensing voltage in an electric field, the sensor being based on Pockel's electro-optic effect. This requires a simple and contactless arrangement of the sensor with the cable.

Blake, U.S. Pat. No. 6,166,816, describes the use of one light source for a combined fiber optic current and voltage sensor. It is, however, difficult to make a clamp-on version of the current sensor disclosed. The electric utility can use it during a new set up or take apart the current carrying cable for installation.

Ishiko et al., U.S. Pat. No. 4,999,571, describes a clamp-on optical current and voltage sensor. The sensor is attached using a two part process that involves a linear slide and rotation. The voltage sensor is based on a capacitive divider that has no ground connection. The ground reference is created by the virtual capacitance between the sensor and the ground. This virtual capacitance changes with in the atmosphere (e.g., humidity, dust), mobile conductive masses such as motor vehicles, and electromagnetic interference from adjacent phases or other sources. Furthermore, the sensor relies upon a mechanical adjustment for accurate readings. The sensor must be attached to the line when the voltage to the line is off. The crystal used in the current sensor is a garnet crystal, which is temperature sensitive. The sensor also uses quarter wavelength plate for the voltage sensor, and this wave plate is also temperature sensitive.

Ykymyshyn et al., U.S. Pat. No. 7,279,870, discloses a method of measuring a current based on multiple Hall-effect based semiconductor sensors combined with electronics and compensated by a source with a reference AC voltage. This method requires installing a solid state electronics adjacent to the power cable and is therefore less reliable due to the exposure to the transients or the effects of lightning on the cable.

Bjorn, U.S. Pat. No. 7,068,025, teaches a simplified sensor based on the Faraday effect that relates a rotation of the plane of polarization in proportion to the intensity of the component of the magnetic field in the direction of the beam of light. Ampere's law relates the integrated magnetic field around a closed loop of a conductor to the electric current passing through the loop. The Bjorn patent teaches a method that samples only one point around the conductor.

This method is sensitive to the magnetic field of an adjacent phase or to the magnetic interferences with other sources. To compensate for those errors, software corrections are utilized, by comparing the readout to a reference current sensor that surrounds the conductor. This compensation method is not accurate when there are changes in the installation. Even common factors such as wind the passage of nearby cars can change the configuration of the measured magnetic field.

C. V Temple et al., U.S. Pat. No. 2,709,800, teaches a power line fault detector that allows mechanical adjustment of the airgap of a concentrator for detecting various levels of current. This sensor may only be used for the detection of fault currents. Temperature and vibrations can induce errors in the readings of this form of detector.

Attarian et al., U.S. Pat. No. 6,844,799, teaches a Hall effect current sensor that utilizes mixed magnetic materials to optimize the dynamic range of the current sensor in a circuit breaker. The device requires fixed dimensions which cannot be adapted to some airgaps, and is therefore constrained with regard to magnetic strips that may be used.

Bosselmann et al., U.S. Pat. No. 5,963,026, discloses two Faraday elements or crystals for two different measurement ranges in order to achieve a higher dynamic range. This adds to the complexity and the cost.

Bluzer, U.S. Pat. No. 4,590,505, discloses a three dimensional optical receiver having programmable gain control. The gain is optimized in a logarithmic way which is not suitable to optical current and voltage sensors, which must be linear in order to maintain the accuracy of the harmonics.

The prior art teaches various devices and methods for measuring the current and the voltage in real time in a current carrying cable using optical sensors. However, the prior art does not teach a low cost and simple sensor design for accurate measurements at large dynamic range, sensitivity and bandwidth, that is capable of being installed on the cable without disturbing the function of the cable. The present invention fulfills these needs and provides further related advantages as described in the following summary.

SUMMARY OF THE INVENTION

The present invention teaches certain benefits in construction and use which give rise to the objectives described below.

The present invention provides an optical sensor assembly for measuring current and voltage in a current carrying cable. The optical sensor assembly comprises a base unit; an optical current sensor mounted on the base unit, the optical current sensor comprising a polarized light input, a light directing device, and a light output, the polarized light input being configured for transmitting a beam of polarized electromagnetic radiation into the light directing device, and out the light output; at least one hook for hanging the base unit from the current carrying cable; a concentrator housing having a first end and a second end; a pivot of the second end of the concentrator housing for pivotally attaching the concentrator housing with the top end of the base unit such that the concentrator housing moves between an open position and a closed position; a magnetic concentrator having a first end and a second end that together define an airgap therebetween, the magnetic concentrator being mounted on the concentrator housing such that the magnetic concentrator fits around the current carrying cable when the base unit is hung from the current carrying cable by the at least one hook and when the concentrator housing is moved to the closed position, and further such that the light directing device of the base unit is operably positioned in the airgap of the magnetic concentrator when the concentrator housing is in the closed position; and a voltage sensor operably positioned on the base unit for measuring the voltage of the current carrying cable.

A primary objective of the present invention is to provide an optical sensor assembly having advantages not taught by the prior art Another objective is to provide an optical current sensor for installation on a current carrying cable without having to disrupt the function of the cable.

Another objective is to provide the optical current sensor having a glass prism, which has significantly less temperature sensitivity than the garnets used in the prior art.

A further objective is to provide a magnetic concentrator pivotally attached to the base unit, able to move between the open and the closed positions, facilitating installation of the assembly.

A further objective is to provide an improved dynamic range and sensitivity of measurement for the optical current sensor, by using the magnetic concentrator with a distributed-airgap.

A further objective is to provide an assembly that is connected to control elements only with optical fibers, and is properly grounded, so that there is reduced danger of high voltage transfer to the control elements.

A further objective is to provide the assembly additionally with an optical voltage sensor for sensing the cable voltage, with a very compact, simple and a low cost arrangement.

A further objective is to provide an electrically conductive tube with at least a part of the first and second optical fibers passing through the tube such that the tube functions as a Faraday cage for the first and second optical fibers.

A further objective is to provide the electrically conductive tube with an electrical connection to the cable through a hook used for suspending the assembly from the cable.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings.

DETAILED DESCRIPTION OF THE INVENTION

The above-described drawing figures illustrate the invention, an optical sensor assembly 10 for installation on a current carrying cable 12, particularly of a high voltage electricity distribution system, for measuring the current and voltage of the current carrying cable 12.

Figure 1:
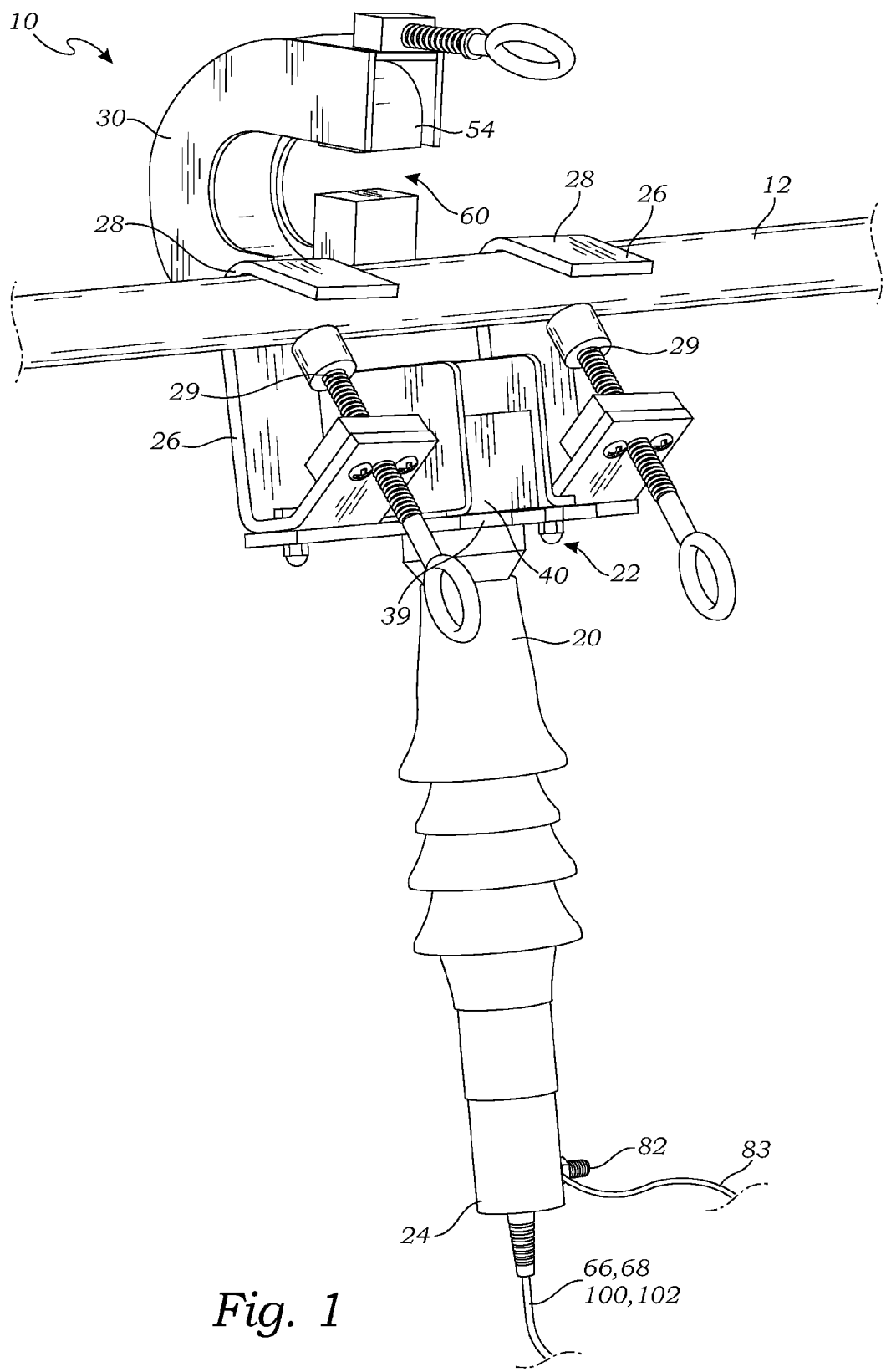
FIG. 1 is a perspective view of an optical sensor assembly when the magnetic concentrator is in open position, according to one embodiment of the present invention.
Figure 2:
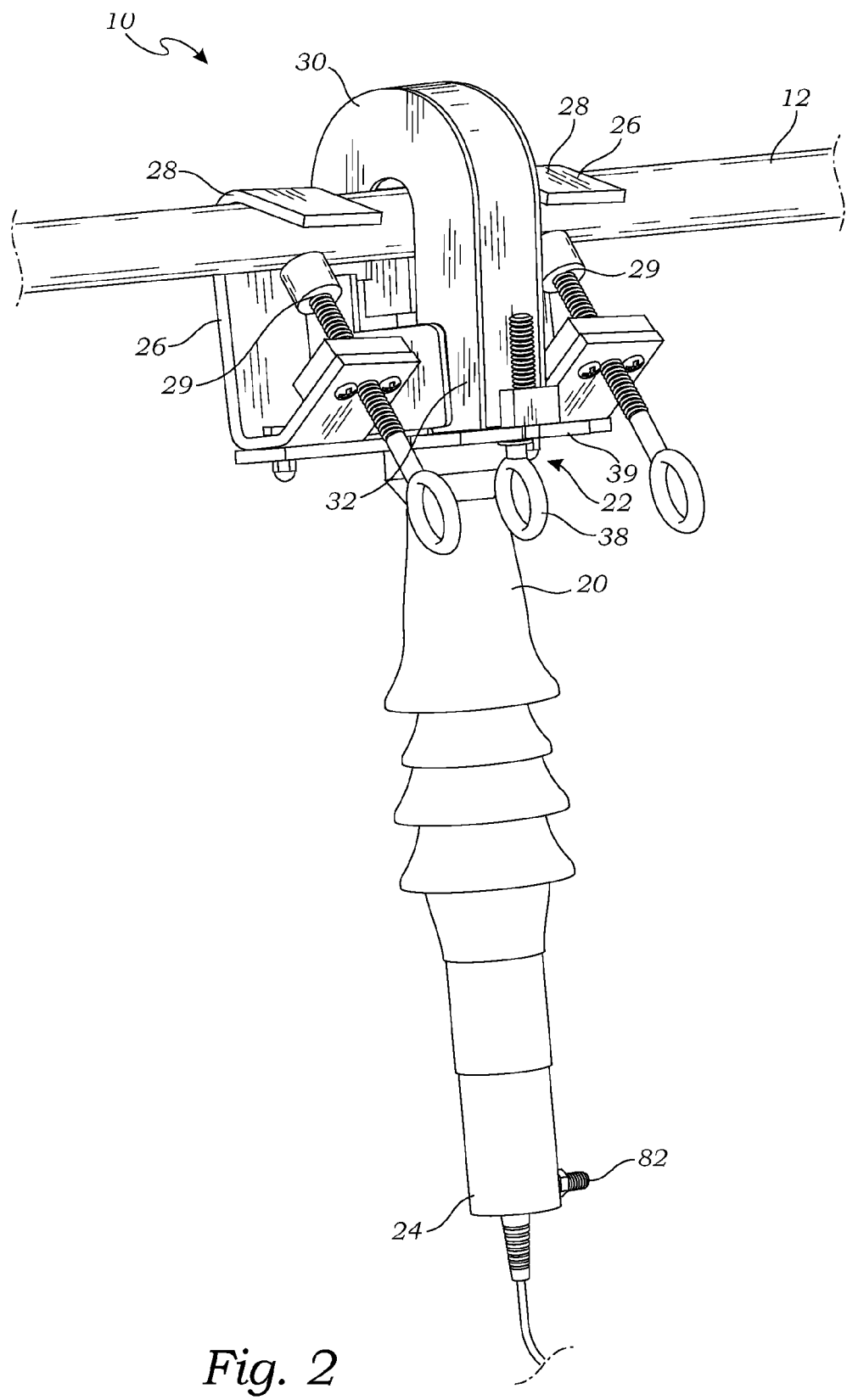
FIG. 2 is a perspective view of FIG. 1 when the magnetic concentrator is in closed position.
Figure 3:
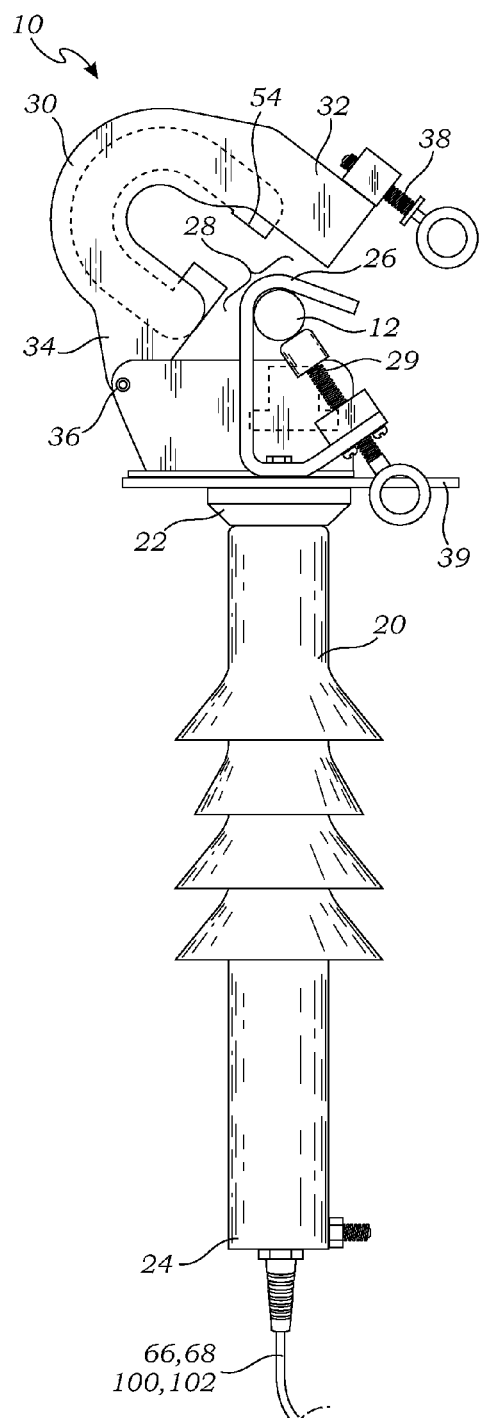
FIG. 3 is a side elevation view of FIG. 1.
Figure 4:
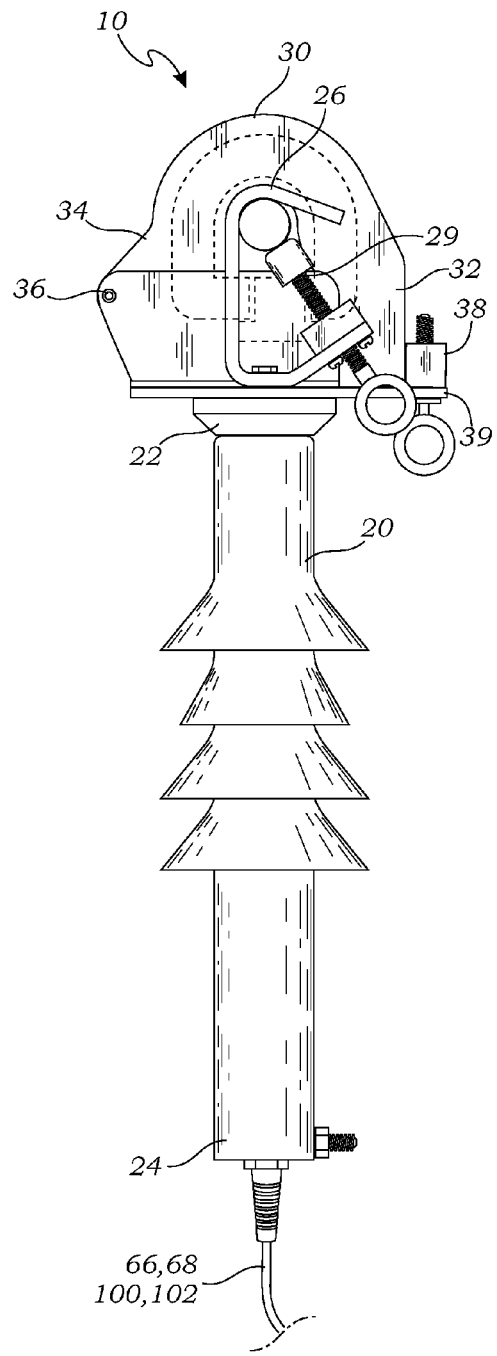
FIG. 4 is a side elevation view of FIG. 2.

FIG. 1 is a perspective view of one embodiment of the optical sensor assembly 10 when a magnetic concentrator 54 is in the open position. FIG. 2 is the same perspective view illustrating the magnetic concentrator 54 in the closed position. FIGS. 3 and 4 represent their side elevation views respectively.

In the embodiment of FIGS. 1-4, the optical sensor assembly 10 comprises a base unit 20 having a top end 22 and a bottom end 24. In this embodiment, the base unit 20 is an elongate structure having an optical current sensor 40 mounted in the top end 22 and a voltage sensor 70 mounted near the bottom end 24. While thus arrangement is advantageous in the present embodiment, those skilled in the art may devise alternative arrangements that should be considered within the scope of the present invention.

The base unit 20 includes at least one hook 26 for hanging the base unit 20 from the current carrying cable 12. In the embodiment of FIGS. 1-4, the at least one hook 26 includes a pair of hooks, one on either side of a light directing device 44 of the optical current sensor 40, as discussed in greater detail below. Each of the hooks 26 may include a curved portion 28 adapted to hand the base unit 20 a predetermined distance D from the current carrying cable 12. Each hook 26 may further include a clamping element 29, such as a screw clamp as illustrated, although other clamps and equivalent fasteners may be used, and the term clamping element 29 is expressly defined to include such alternative constructions. The clamping element 29 clamps the current carrying cable 12 against the curved portion 28 of the hook 26 to secure the base unit 20 in place on the current carrying cable 12, so that the assembly remains physically stable relative to the cable even in rough weather conditions.

A concentrator housing 30 is attached to the top end 22 of the base unit 20 for securing the magnetic concentrator 54 around the current carrying cable 12. The concentrator housing 30 has a first end 32 and a second end 34. A pivot 36 of the second end 34 of the concentrator housing 30 pivotally attaches the concentrator housing 30 with the top end 22 of the base unit 20 such that the concentrator housing 30 moves between an open position and a closed position. The term pivot 36 is hereby defined to include any movable connection that enables the concentrator housing 30 to move in a manner that properly positions the magnetic concentrator 54 around the current carrying cable 12, as described herein, and includes any alternative or equivalent constructions known to those skilled in the art.

In the open position, the concentrator housing 30 is moved away from the base unit 20. In the closed position, the concentrator housing 30 positions the magnetic concentrator 54 around the current carrying cable 12 such that the current carrying cable 12 passes through the magnetic concentrator 54 without physically touching the magnetic concentrator 54 or the concentrator housing 30.

A locking element 38 is provided for removably securing the first end 32 of the concentrator housing 30 to the base unit 20 in the closed position. In the present embodiment, the locking element 38 is a screw-type clamp attached to the concentrator housing 30 that removably engages a flange 39 of the base unit 20. The locking element 38 locks the concentrator housing 30 in the closed position, thereby maintaining the magnetic concentrator 54 in its proper position relative to the current carrying cable 12, as described in greater detail below.

Figure 5:
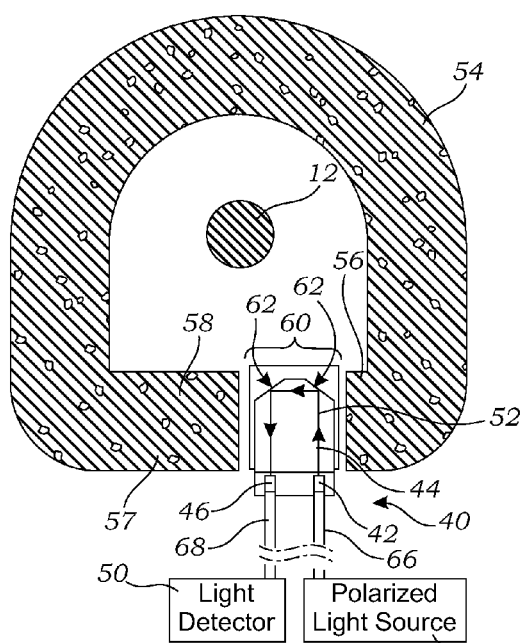
FIG. 5 is a side elevation view of the magnetic concentrator as in FIGS. 2 and 4, in relation to the cable and the current sensor, the magnetic concentrator further illustrating distributed-airgap in the concentrator, according to an embodiment of the invention.

FIG. 5 is a side elevation view of the magnetic concentrator 54 of FIGS. 2 and 4, in relation to the current carrying cable 12 and the optical current sensor 40. As illustrated in FIG. 5, the optical current sensor 40 comprises a polarized light input 42, a light directing device 44 (e.g., reflective prism, mirror(s), etc.), and a light output 46. The polarized light input 42 is operably connected with a polarized light source 48, and the light output 46 is operably connected to a light detector 50. The polarized light source 48 is configured for transmitting a beam of polarized electromagnetic radiation 52 via the polarized light input 42 into the reflective prism 44, where it is reflected out the light output 46, and to the light detector 50 for analysis.

As illustrated in FIG. 5, the magnetic concentrator 54 has a first end 56 and a second end 58 that together define an airgap 60 therebetween. The magnetic concentrator 54 is mounted on the concentrator housing 30 such that the magnetic concentrator 54 fits around the current carrying cable 12 when the base unit 20 is hung from the current carrying cable 12 by the at least one hook 26 and when the concentrator housing 30 is moved to the closed position. In this position, the reflective prism 44 of the base unit 20 is operably positioned in the airgap 60 of the magnetic concentrator 54 when the concentrator housing 30 is in the closed position.

The optical current sensor 40 is mounted on the base unit 20 such that it is positioned in the airgap 60 is used for sensing the current in the cable, where, as shown in FIG. 5, the current sensor 40 is provided within the base unit 20 and accommodated with a relief in the airgap 60 when in the closed position. The light input 42 is configured for transmitting the first beam of polarized electromagnetic radiation 52 to the light output 46. The beam is transmitted through the light directing device 44 to exit from the light output 46 so it may be received by the light detector 50. A magnetic field created by the current, per Ampere's law, is concentrated by the magnetic concentrator 54 into the airgap 60. The plane of polarization of the beam is rotated by the magnetic field in the airgap 60, the rotation being proportional to the strength of the magnetic field in the airgap 60 (Faraday effect). The light detector 50 measures this rotation for representing a current level and a current direction in the cable. The path of the beam within the current sensor 40 may preferably be along the magnetic field.

The light directing device 44 may be, in one embodiment, a reflective prism. The reflective prism 44 may be any shape that directs the light from the light input 42 to the light output 46. In the present embodiment, the reflective prism 44 is a glass tombstone having a pair of reflective surfaces 62 for directing the beam as described above. While prior art applications use garnets or other materials, glass provides benefits such as low temperature sensitivity. Other shapes of reflective prism 44, mirror, or fiber optic configuration may alternatively be used.

When an optical sensor based on the Faraday effect is used, the sensitivity of the sensor depends on the beam travel length along the magnetic field. For a selected width of the airgap 60, the current sensor 40 can be designed to a dimension that utilizes the maximum sensitivity so that the sensitivity lost due to the airgap 60 will be gained by the travel of the beam in the current sensor 40. The shape of the magnetic concentrator 54 and the size of the airgap 60 can be optimized to accommodate the largest size of the current sensor 40. The current sensor 40 is designed to maximize the length of the beam to increase sensitivity. The difference in the size of the airgap 60 and the current sensor 40 is used to allow housing with a relief. The assembly is configured to avoid using the ¼ wave plate as described in prior art articles. The ¼ wave plate requires more complex temperature compensation, and this is avoided using the present assembly 10.

The beam of polarized electromagnetic radiation 52 is preferably aligned substantially along the magnetic field in the airgap 60. The magnetic field in the airgap 60 rotates the plane of polarization of the beam 52 within the reflective prism 44. The rotation is proportional to the strength of the magnetic field in the airgap 60 and measurable by the light detector 50 for determining the current in the current carrying cable 12.

In the embodiment of FIG. 5, the magnetic concentrator 54 is D-shaped and includes a flattened portion 57, with the airgap 60 being positioned in an offset position at the edge of the flattened portion 57, so that the airgap 60 fits around the cable 12 during installation. In this embodiment, the magnetic concentrator 54 does not have to include any form of break or hinge to be installed; however, the unique shape prohibits the use of off-the-shelf materials.

Figure 6A:
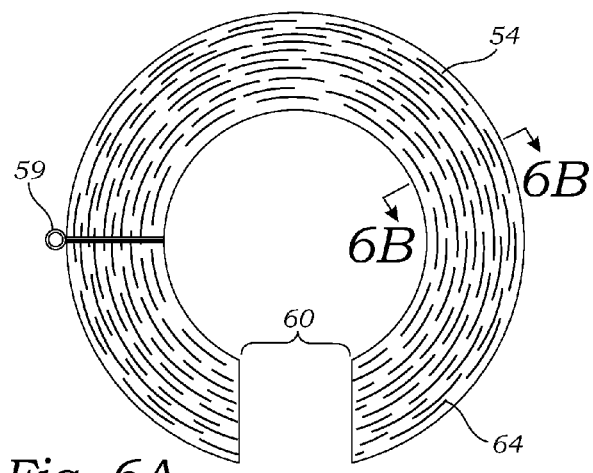
FIG. 6A is a side elevation view of the magnetic concentrator as in FIGS. 1 to 4, illustrating distributed-airgap in the concentrator, with laminations of a magnetic material in a medium of non-magnetic material, according to an embodiment of the invention.

In the embodiment of FIG. 6A, the magnetic concentrator 54 may be C-shaped. While this allows the use of more standard components, it typically must further include a hinge 59 to facilitate installation. While two embodiments are disclosed, the magnetic concentrator 54 may include any similar or equivalent shape that functions to provide the necessary magnetic field to the airgap 60.

Figure 7:
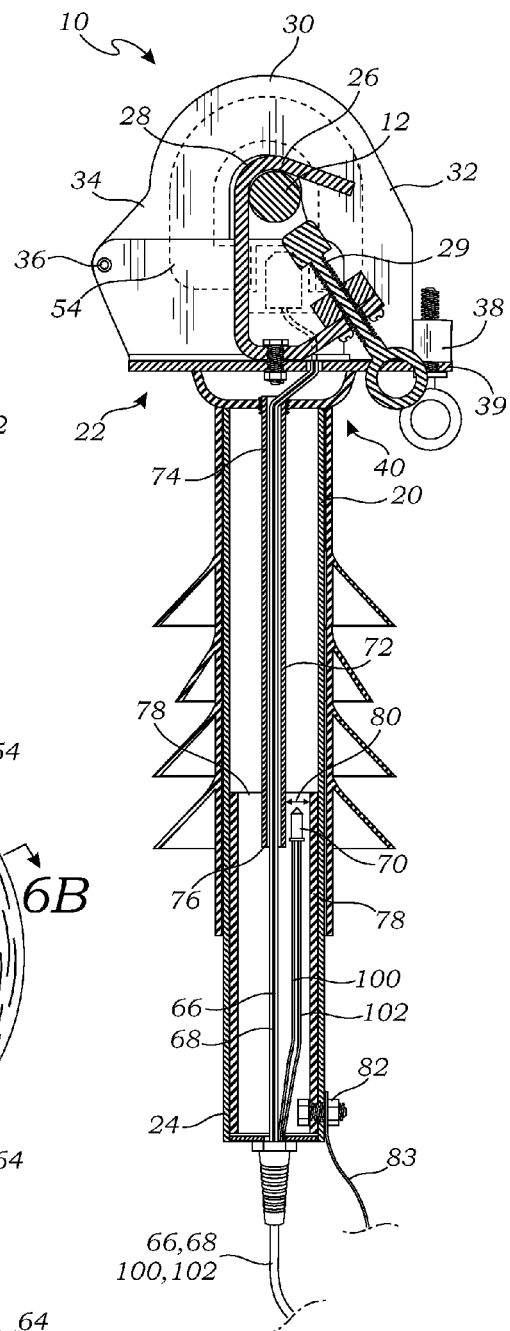
FIG. 7 is a side elevation view of the interior of the assembly along with the optical voltage sensor.

In the embodiment of FIGS. 5 and 7, the optical sensor assembly 10 includes a first optical fiber 66 for transmitting the beam of polarized electromagnetic radiation 52 from a polarized light source 48 to the polarized light input 42 of the reflective prism 44; and further includes a second optical fiber 68 for transmitting the beam of polarized electromagnetic radiation 52 from the light output 46 of the reflective prism 44 to the light detector 50. The first and second optical fibers 66 and 68 may extend to electronics components, controllers, and the like located either inside or outside of the base unit 20, as discussed in greater detail below.

In the embodiment of FIG. 5, the magnetic concentrator 54 comprises at least one type of soft magnetic powder mixed with at least one type of non-magnetic material for creating a distributed-airgap in the magnetic concentrator 54.

Figure 6B:
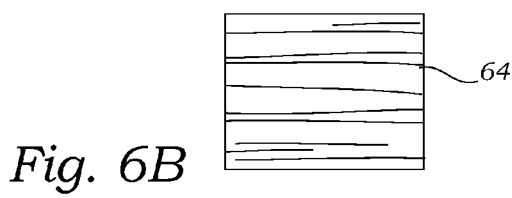
FIG. 6B is a cross-sectional view thereof, taken along line 6B-6B in FIG. 6A.

Alternatively, as illustrated in FIG. 6A, along with a cross-sectional view of the magnetic concentrator 54 in FIG. 6B, the magnetic concentrator 54 includes a plurality of laminations 64 of at least one type of magnetic material mixed with at least one type of non-magnetic material. The laminations 64 are arranged to create the distributed-airgap 60. These mixed magnetic materials function to optimize the dynamic range of the optical current sensor 40 and increase the saturation level of the magnetic concentrator 54 while maintaining an acceptable level of sensitivity in low currents, with low influence of adjacent magnetic fields.

FIG. 7 is a sectional view of FIG. 4, illustrating various internal components of the optical sensor assembly 10. As shown in FIG. 7, the optical sensor assembly 10 may further include a voltage sensor 70 operably mounted on or within the base unit 20 for sensing the voltage of the current carrying cable 12. The voltage sensor 70 may be placed near the bottom end 24 of the base unit 20 so that the voltage sensor 70 is positioned in a stable electronic field which is protected from outside interference. Furthermore, as described in greater detail below, electronics components are located remotely from the high voltage cable, via fiber optics as described below, such that deteriorating effects of high voltage transients, lightning and other weathering conditions on the electronics parts can be reduced; however, these components may be placed elsewhere as determined by one skilled in the art.

In the embodiment of FIG. 7, the assembly 10 may include an electrically conductive tube 72 having a proximal end 74 and a distal end 76. The proximal end 74 may be electrically connected to the current carrying cable 12 (e.g., via the hooks 26, or other means) when the assembly is mounted on the at least one hook 26. In this embodiment, the assembly may further include a grounded surface 78 mounted proximate to the electrically conductive tube 72, separated by a gap 80 from the electrically conductive tube 72. The grounded surface 78 is maintained at a ground potential via a ground stud 82 adapted to be attached via a ground wire 83 to a grounded element, as is known in the art. The term "ground stud" is hereby defined to include any attachment point or feature otherwise adapted to be attached to a grounded element. While one embodiment is illustrated herein, those skilled in the art may devise alternative constructions that should also be considered within the scope of the present invention.

In this embodiment, the voltage sensor 70 is an optical voltage sensor operably positioned in the gap 80 between the electrically conductive tube 72 and the grounded surface 78.

In one embodiment, the optical voltage sensor 70 may include an input for a second beam of polarized electromagnetic radiation having at least two components propagating along at least two orthogonal planes, and further including a sensor for sensing a differential phase shift on the components as the second beam travels through the gap 80 between the electrically conductive tube 72 and the grounded surface 78. For example, the voltage sensor 70 may be an electro-optic voltage sensor including a transmitter, sensor, reflector, and detector. The transmitter may be configured to transmit a beam of polarized electromagnetic radiation having two components propagating along orthogonal planes. The sensor may be subjected to the portion of the field and configured to induce a differential phase shift in the orthogonal beam components dependent upon the magnitude of the portion of the field. The reflector may receive the beam after passing through the sensor and direct the beam back through the sensor. The detector may detect the differential phase shift of the orthogonal beam components and produce the signal dependent upon the differential phase shift. A suitable electro-optic voltage sensor is disclosed in U.S. Pat. No. 5,892,357 issued to Woods et al., the contents of which are hereby incorporated by reference in full. See also U.S. Pat. No. 7,199,571, which is also hereby incorporated by reference in full.

Also illustrated in FIG. 7, the first and second optical fibers 66 and 68 of the optical current sensor 40 may be positioned through the electrically conductive tube 72 such that the electrically conductive tube 72 functions as a Faraday cage for protecting the first and second optical fibers 66 and 68.

There may be cases were the assembly 10 may be used for more than one application. For example, the assembly 10 may simultaneously be used for fault allocation together with regulating the quality of power. In those cases more, than one channel of analog to digital conversion may be used. The analog to digital conversion can be done by more then one analog to digital converters or multichannel analog to digital converter. This 'multi channel gain' approach can also be implemented by software instead of hardware.

The same improvement is used in the optical voltage sensor 70 to enable measurement of lower voltages and very high transients with the same design of optics and housing of the sensor. When properly designed, the dynamic range of the optical voltage sensor 70 is limited by the noise floor of the electronics and the power supplies. Multiple channels for analog to digital conversion or a multichannel analog to digital converter may be used.

The magnetic concentrator 54 is low in cost, it may be easily clamped onto existing cables 12 without cutting the cables 12, and provides a better dynamic range in comparison to prior art solutions. By properly selecting the magnetic concentrator 54 and adapting the electronics, the sensors can be used for multiple applications. For example, assuming a 600 ampere nominal current sensor 40 being used for measurement of very high fault current (e.g., >5,000 amperes), the electronics must be fast, high in bandwidth, but lower in gain and accuracy. Currents less than 1 ampere may be measured at a lower bandwidth for several reasons. A normal harmonic content should be less than 5% and 5% of 1:600 ampere is negligible (0.000083 ampere) for metering and for quality of power. Therefore, a bandwidth of about 200 Hz is acceptable at this current. Current state of electronics allows dynamic adjustment of the gain and the bandwidth. The lower limit is the noise floor of the source of the beam(s) and of the electronics, and the higher limit is the saturation of the magnetic concentrator 54 and the power supply levels of the electronics.

Figure 8A:
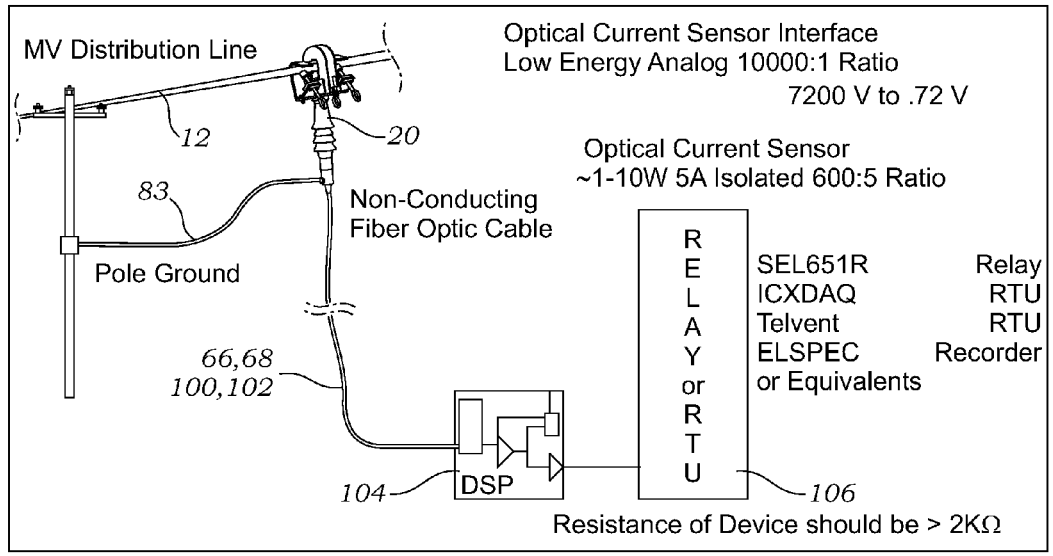
FIG. 8A is an illustration of the assembly according to a first embodiment of the invention, wherein the assembly is suspended from a current carrying cable of a high voltage electricity distribution system and connected to an electronics system for control and evaluation of the current and voltage levels in the cable.

FIG. 8A illustrates an arrangement for the assembly 10 according to an embodiment of the invention, wherein the base unit 20 is suspended from the cable 12 in a high voltage electricity distribution system, and is connected to an electronics system for control and evaluation of the current and voltage levels in the cable 12. The grounded element may be provided by a pole of the electricity distribution system, or any other suitable grounded structure or element. As illustrated, the first optical fiber 66 may be operably connected to an electronics circuit including a computing unit 104 such as a digital signal processor DSP, the output of which may be fed to a relay unit 106

Figure 8B:
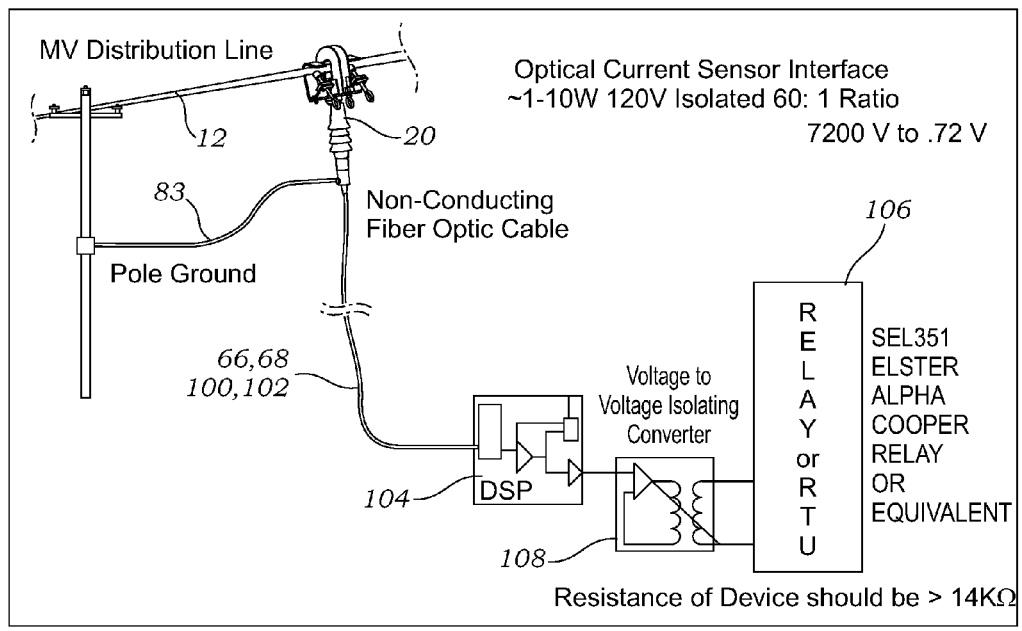
FIG. 8B is an illustration of a second embodiment thereof.
Figure 8C:
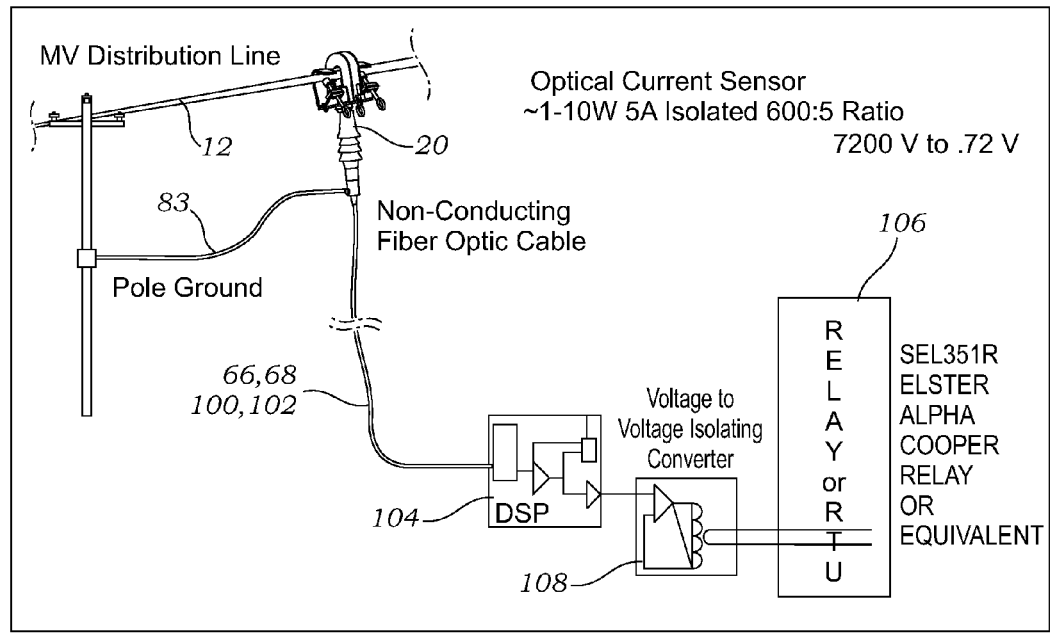
FIG. 8C is an illustration of a third embodiment thereof.
Figure 8D:
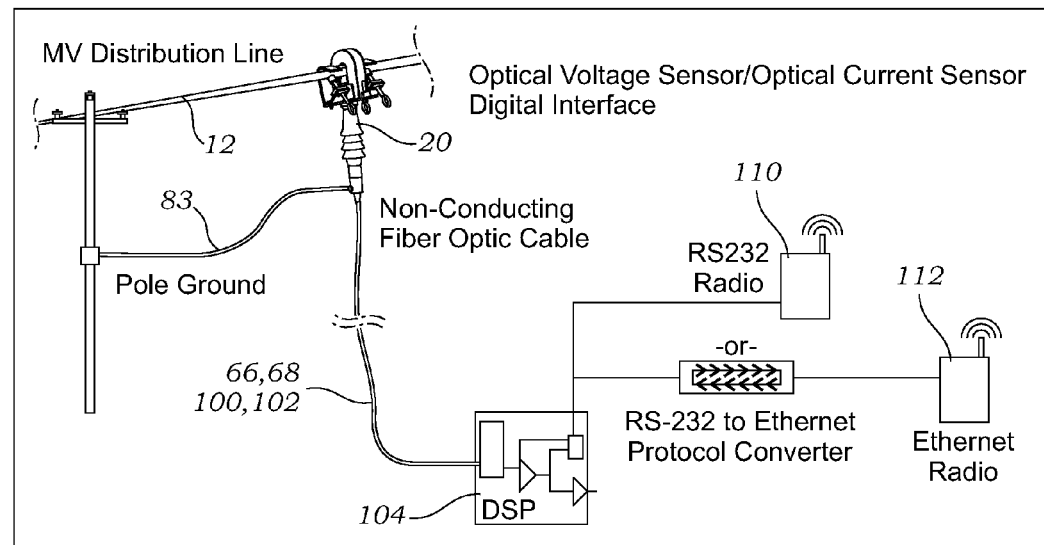
FIG. 8D is an illustration of a fourth embodiment thereof.

Other configurations are also possible, as illustrated in FIGS. 8B-8D. In the embodiment of FIG. 8B, the computing unit 104 is connected to the relay unit 106 through a voltage isolating converter 108. In the embodiment of FIG. 8C, the use of an alternative relay is shown. In the embodiment of FIG. 8D, the computing unit 104 is operably attached to wireless devices such as RS232 radio 110 and/or Ethernet radio 112.

Figure 9:
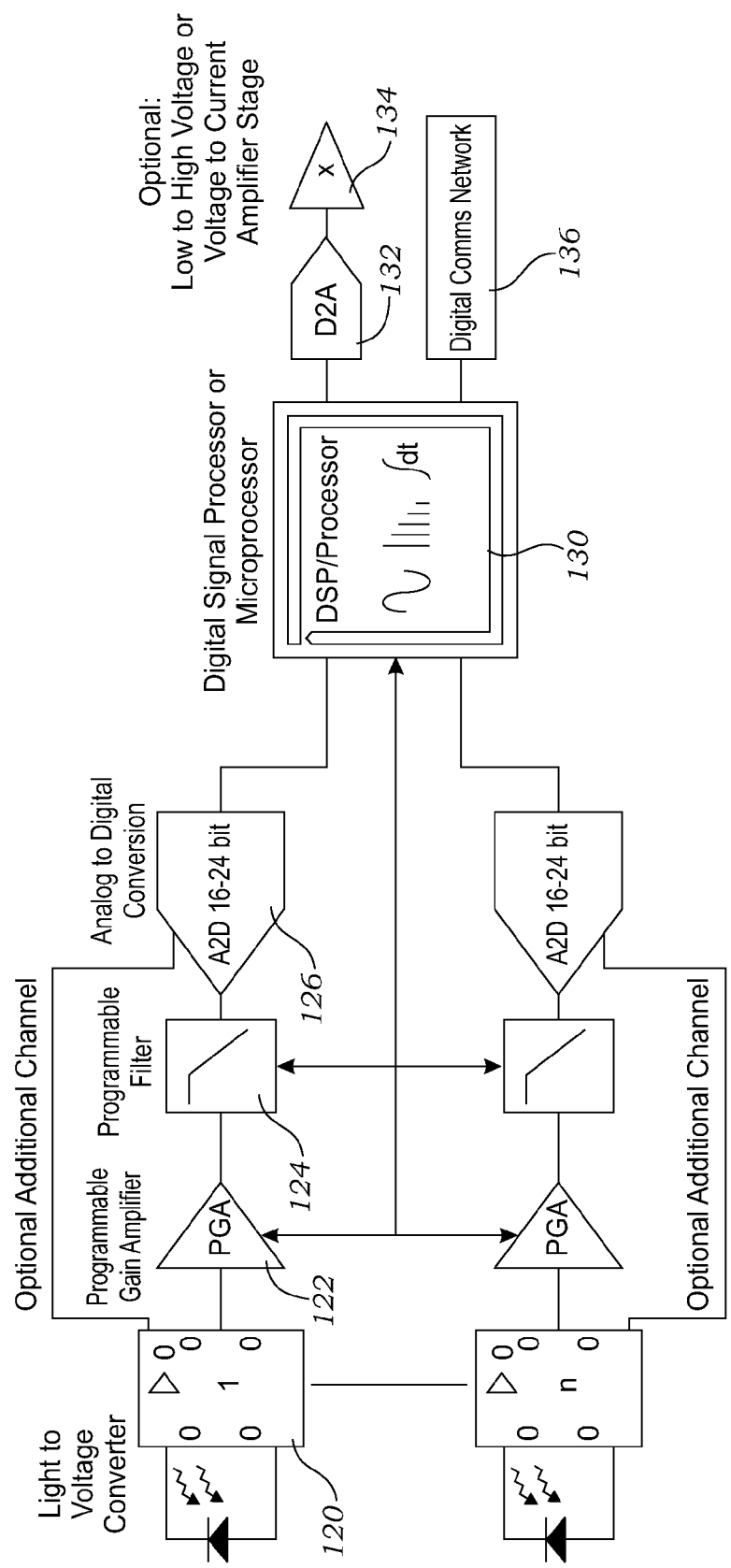
FIG. 9 is a schematic diagram of one embodiment of the electronics system of FIG. 8A.

FIG. 9 is one example of an electronics system of FIG. 8 wherein the beam of polarized electromagnetic radiation 52 (illustrated in FIG. 7) is directed (e.g., by optical fiber) to create current in a photodiode 120. The photodiode 120 may include multiple channels. The term "photodiode" is hereby defined to include similar light sensitive components such as a photo resistor or photo transistor. The light may be converted to voltage and connected directly or through other gain stages to a programmable gain amplifier (PGA) 122. The amplification channels may be divided to many channels in order to differentiate between the AC and DC component of the beam or to accommodate more than one sensor. The PGA 122 may be of a type that gets a computer command through computer bus discrete commands, such as by changing a resistor or voltage (as in Voltage Control Amplifier) or current command. This programming of the gain may be called Automatic Gain Control (AGC) as in the art of radio. The PGA 122 may include a low pass or a band pass filter or be connected to a separate filter 124. The filter 124 may include passive and or active components. The filtered signal is directed to an analog to digital converter (ADC) 126 that will send the signal to the computing device 130, such as the DSP or a microprocessor or a computer. Some analog to digital converters 126 may have filters such as for oversampling and averaging, which may be used separately or in addition to the other filters. The computing device may determine the gain and the bandwidth required based on the signal level and the application, and will control the PGA 122, the filter 124, and ADC 126 accordingly.

The optical sensor(s) can be interfaced through analog or digital outputs. In one embodiment, the analog output can be a low energy output. For example, a ratio of 10,000:1 may be used for voltage, in this case 7200 volts on the cable 12 will be represented by 0.71 volts. Other ratios can be provided per customer request. A current may also be represented by a voltage. For example, 500 ampere may be represented by 1 volt. This low energy analog interface will be generally connected to a Remote Terminal Unit (RTU), an Intelligent Electronic Device (IED), a Programmable Logic Controller (PLC), a Supervisory Control and Data Acquisition System (SCADA), or a Relay 106, to send the information to a control system.

When legacy equipment is interfaced with the sensors, such as revenue meters or old relays, power amplifiers may be added (to mimic instrument transformers) to the analog output. A typical voltage to a meter in the United States is 120 volts, so a ratio of 60:1 will provide 120 volts when the cable 12 has 7200 volts. Other voltages up to 1,000 volts are available. A voltage to current amplifier may be connected to the analog output; for example, a 600:5 ampere ratio is typical in the United States.

For more modern smart grid applications, the digital output may be used. The most common are the RS-232 and/or the Ethernet. The computing unit 130 may be programmed to utilize the standard protocol in the customer region.

Those skilled in the art will recognize that more than one output per sensor may be used, with different scaling, to enable different instruments to be operably connected to the system, or a single instrument may be connected with multiple inputs. For example, metering, quality of power, and fault allocation monitors may simultaneously operate from the same output.

While illustrative examples are provided, those skilled in the art may devise alternative arrangements and components to meet the specific needs of certain installations and requirements. Such alternative embodiments, and equivalents, should be considered within the scope of the present invention.

As used in this application, the words "a," "an," and "one" are defined to include one or more of the referenced item unless specifically stated otherwise. Also, the terms "have," "include," "contain," and similar terms are defined to mean "comprising" unless specifically stated otherwise. Furthermore, the terminology used in the specification provided above is hereby defined to include similar and/or equivalent terms, and/or alternative embodiments that would be considered obvious to one skilled in the art given the teachings of the present patent application.

What is claimed is:

1. An optical sensor assembly for measuring current and voltage in a current carrying cable, the optical sensor assembly comprising:

a base unit having a top end and a bottom end;

an optical current sensor mounted in the top end of the base unit, the optical current sensor comprising a polarized light input, a reflective prism, and a light output operably connected to a light detector, the polarized light input being configured for transmitting a beam of polarized electromagnetic radiation into reflective prism, out the light output, and to the light detector;

at least one hook for hanging the base unit from the current carrying cable;

a concentrator housing having a first end and a second end;

a pivot of the second end of the concentrator housing for pivotally attaching the concentrator housing with the top end of the base unit such that the concentrator housing moves between an open position and a closed position;

a locking element for removably securing the first end of the concentrator housing to the base unit in the closed position;

a magnetic concentrator having a first end and a second end that together define an airgap therebetween, the magnetic concentrator being mounted on the concentrator housing such that the magnetic concentrator fits around the current carrying cable when the base unit is hung from the current carrying cable by the at least one hook and when the concentrator housing is moved to the closed position, and further such that the reflective prism of the base unit is operably positioned in the airgap of the magnetic concentrator when the concentrator housing is in the closed position;

wherein a plane of polarization of the beam of polarized electromagnetic radiation within the reflective prism is rotated by the magnetic field in the airgap, the rotation being proportional to the strength of the magnetic field in the airgap and measurable by the light detector for determining the current in the current carrying cable; and a voltage sensor operably mounted within the base unit for measuring the voltage of the current carrying cable.

2. The assembly according to claim 1, wherein the reflective prism comprises a glass prism.

3. The assembly according to claim 1, wherein the current sensor comprises a glass tombstone having a pair of surfaces for directing the beam of polarized electromagnetic radiation from the light input to the light output.

4. The assembly according to claim 1, wherein the beam of polarized electromagnetic radiation aligns substantially along the magnetic field in the airgap.

5. The assembly according to claim 1, wherein the magnetic concentrator comprises at least one type of soft magnetic powder mixed with at least one type of non-magnetic material for creating a distributed-airgap in the magnetic concentrator.

6. The assembly according to claim 1, wherein the magnetic concentrator comprises a plurality of laminations of at least one type of magnetic material mixed with at least one type of non-magnetic material and arranged to create a distributed-airgap in the magnetic concentrator.

7. The assembly according to claim 1, further comprising:
a first optical fiber for transmitting the beam of polarized electromagnetic radiation from an polarized light source to the polarized light input of the reflective prism; and
a second optical fiber for transmitting the beam of polarized electromagnetic radiation from the light output of the reflective prism to the light detector.

8. The assembly according to claim 1, further comprising:
an electrically conductive tube having a proximal end electrically connected to the current carrying cable when the assembly is mounted on the at least one hook, and a distal end;
a grounded surface mounted proximate to the electrically conductive tube, separated by a gap from the electrically conductive tube, the surface being maintained at a ground potential; and
wherein the voltage sensor is an optical voltage sensor operably positioned in the gap between the electrically conductive tube and the grounded surface.

9. The assembly according to claim 8, wherein a second beam of polarized electromagnetic radiation, having at least two components propagating along at least two orthogonal planes, is sensed by the optical voltage sensor for determining a differential phase shift on the components as the second beam travels through the gap between the electrically conductive tube and the grounded surface.

10. The assembly according to claim 9, wherein the optical voltage sensor further includes a processor for measuring the phase shift of the light beam components for relating a magnitude of the phase shift to a voltage level in the current carrying cable.

11. The assembly according to claim 10, further comprising input and output optical fibers operably connected to the optical voltage sensor.

12. The assembly according to claim 8, wherein the first and second optical fibers of the optical current sensor are positioned through the electrically conductive tube such that the electrically conductive tube functions as a Faraday cage for protecting the first and second optical fibers.

13. The assembly according to claim 8, wherein the at least one hook is electrically conductive, and wherein the electrically conductive tube is electrically connected to the current carrying cable through the at least one hook.

14. The assembly according to claim 1, wherein the at least one hook includes a pair of hooks, one on either side of the reflective prism of the optical current sensor.

15. An optical sensor assembly for measuring current and voltage in a current carrying cable, the optical sensor assembly comprising:
a base unit;
an optical current sensor mounted on the base unit, the optical current sensor comprising a polarized light input, a light directing device, and a light output, the polarized light input being configured for transmitting a beam of polarized electromagnetic radiation into light directing device, and out the light output;
at least one hook for hanging the base unit from the current carrying cable;
a concentrator housing having a first end and a second end;
a pivot of the second end of the concentrator housing for pivotally attaching the concentrator housing with the top end of the base unit such that the concentrator housing moves between an open position and a closed position;
a magnetic concentrator having a first end and a second end that together define an airgap therebetween, the magnetic concentrator being mounted on the concentrator housing such that the magnetic concentrator fits around the current carrying cable when the base unit is hung from the current carrying cable by the at least one hook and when the concentrator housing is moved to the closed position, and further such that the light directing device of the base unit is operably positioned in the airgap of the magnetic concentrator when the concentrator housing is in the closed position; and
a voltage sensor operably positioned on the base unit for measuring the voltage of the current carrying cable.

16. An optical sensor assembly for measuring current and voltage in a current carrying cable, the optical sensor assembly comprising:
a base unit;
an optical current sensor mounted on the base unit, the optical current sensor comprising a polarized light input, a light directing device, and a light output, the polarized light input being configured for transmitting a beam of polarized electromagnetic radiation into the light directing device, and out the light output;

a magnetic concentrator having a first end and a second end that together define an airgap therebetween, the magnetic concentrator being mounted on the base unit such that the magnetic concentrator fits around the current carrying cable when the base unit is hung from the current carrying cable, and further such that the light directing device of the base unit is operably positioned in the airgap of the magnetic concentrator when the concentrator housing is in the closed position;

an electrically conductive tube having a proximal end electrically connected to the current carrying cable, and a distal end;

a grounded surface mounted proximate to the electrically conductive tube, separated by a gap from the electrically conductive tube, the surface having a ground stud adapted for attachment to a ground potential; and an optical voltage sensor operably positioned in the gap between the electrically conductive tube and the grounded surface.

* * * * *